(12) United States Patent
Ishihara

(10) Patent No.: US 7,102,406 B2
(45) Date of Patent: Sep. 5, 2006

(54) PHASE DETECTOR, CLOCK DISTRIBUTION CIRCUIT, AND LSI

(75) Inventor: Fujio Ishihara, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 51 days.

(21) Appl. No.: 10/816,808

(22) Filed: Apr. 5, 2004

(65) Prior Publication Data

US 2005/0099208 A1  May 12, 2005

(30) Foreign Application Priority Data

Nov. 10, 2003  (JP) ............................ P2003-380317

(51) Int. Cl.
  *H03K 3/356* (2006.01)

(52) U.S. Cl. ..................... 327/200; 327/201; 327/3; 327/12; 365/233

(58) Field of Classification Search ..................... None
See application file for complete search history.

(56) References Cited

U.S. PATENT DOCUMENTS 6,429,687 B1    8/2002   Ishihara et al. ............... 326/93

OTHER PUBLICATIONS

Vadim Gutnik, et al. "Active GHz Clock Network Using Distributed PLLs", 2000 IEEE International Solid-State Circuits Conference, pp. 174-175.
Nasser A. Kurd, et al. "A Multigigahertz Clocking Scheme for the Pentium 4 Microprocessor", IEEE Journal of Solid-State Circuits, vol. 36, No. 11, Nov. 2001, pp. 1647-1653.
Charles E. Dike, et al. "A Design for Digital, Dynamic Clock Deskew", 2003 Symposium on VLSI Circuits Digest of Technical Papers, Session 2 Advanced Clock Design, pp. 21-24.

*Primary Examiner*—Kenneth B. Wells
*Assistant Examiner*—An T. Luu
(74) *Attorney, Agent, or Firm*—Oblon, Spivak, McClelland, Maier & Neustadt, P.C.

(57) ABSTRACT

A phase detector includes a first selection circuit configured to select a first clock from a first group of clocks supplied to the first selection circuit and to transmit the first clock, and at least one phase comparator configured to detect a difference in phases between the first clock and a second clock supplied to the phase comparator and to transmit the difference as a scan signal.

15 Claims, 9 Drawing Sheets

PHASE DETECTOR, CLOCK DISTRIBUTION CIRCUIT, AND LSI

CROSS REFERENCE TO RELATED APPLICATIONS

This application is based upon and claims the benefit of priority from the prior Japanese Patent Application No. P2003-380317, filed on NOV. 10, 2003; the entire contents of which are incorporated herein by reference.

BACKGROUND OF THE INVENTION

1. Field of the Invention

This present invention relates to a phase detector, clock distribution circuit, and Large Scale Integration to adjust a clock skew.

2. Description of the Related Art

It is important to reduce a clock skew in a synchronous circuit because a large clock skew causes a set-up time/hold time violation. Accordingly, a Large Scale Integration (LSI) operating at high frequency especially at gigahertz clock speed is designed to reduce the skew as required. Therefore, a balanced tree of clock buffers shown in FIG. 1 is used. The balanced tree is technique to distribute the clock with reduced skew to a large number of flip-flops (F/Fs) in the LSI. The F/Fs layed out in a plurality of domains in the LSI are clustered, and the F/Fs in the same cluster are connected to the domain clock buffer with the same propagation delay. For example, as shown in FIG. 1, the F/Fs are connected to each of domain clock buffers 1a to 1h. Then, the domain clock buffers are clustered and connected to another buffer with the same propagation delay. For example, the cluster of domain clock buffers 1a, 1b, 1e, 1f in domains A, B, E, F is connected to a buffer 2a and the cluster of domain clock buffers 1c, 1d, 1g, 1h in domains C, D, G, H is connected to a buffer 2d. Buffers are connected to a clock source with the same propagation delay. In such a way, the balanced tree is designed from bottom-up.

However, even for a balanced tree so designed, the skew still remains in the manufactured LSI because of difficulty of wiring all of the buffers with the same propagation delay or wire capacitance. Therefore, there is a method whereby a phase detector (PD) located in the boundary of the domain detects the skew between two domain clock buffers in two domains that face across the tile boundary and reduces the skew in the manufactured LSI by adjusting the propagation delay of the buffers.

However, as shown in FIG. 2, the phase detectors PD1 to PD24 placed at the boundary of domain A to P in the LSI 5 detect the skew between only two domain clock buffers. For example, the phase detector PD 3 detects the skew between clock CK-B transmitted from the domain clock buffer 1b in the domain B and clock CK-F transmitted from the domain clock buffer 1f in the domain F. Because phase detectors are mounted at the every boundary of the two domains facing across each of the boundaries, the number of phase detectors is large and a large number of the phase detectors creates difficulties in the layout and wire planning of the LSI and increases the LSI area.

In particular, an LSI operating at high clock speed above 1 gigahertz requires minimal skew. The more the LSI area is broken into domains for minimizing the skew, the larger the number of phase detectors. The larger the integration of the LSI, and the larger the number of domains of the LSI and phase detectors.

SUMMARY OF THE INVENTION

An aspect of the present invention inheres in a phase detector including a first selection circuit configured to select a first clock from a first group of clocks supplied to the first selection circuit and to transmit the first clock, and at least one phase comparator configured to detect a difference in phases between the first clock and a second clock supplied to the phase comparator and to transmit the difference as a scan signal.

Another aspect of the present invention inheres in A clock distribution circuit comprising, a plurality of domain clock buffers configured to supply clocks to logic elements, a first selection circuit configured to select a first clock from a first group of the clocks supplied from the domain clock buffers and to transmit the first clock and at least one phase comparator configured to detect a difference in phases between the first clock and a second clock supplied to the phase comparator and to transmit the difference as a scan signal.

Still another aspect of the present invention inheres in A LSI comprising a plurality of divided domains in the LSI area, at least one clock buffer configured to supply clocks to logic elements in the domains, a first selection circuit configured to select a first clock from a first group of the clocks supplied from the domain clock buffers and to transmit the first clock and at least one phase comparator configured to detect a difference in phases between the first clock and a second clock supplied to the phase comparator and to signal the difference as a scan signal.

DETAILED DESCRIPTION OF EMBODIMENTS

Figure 1:
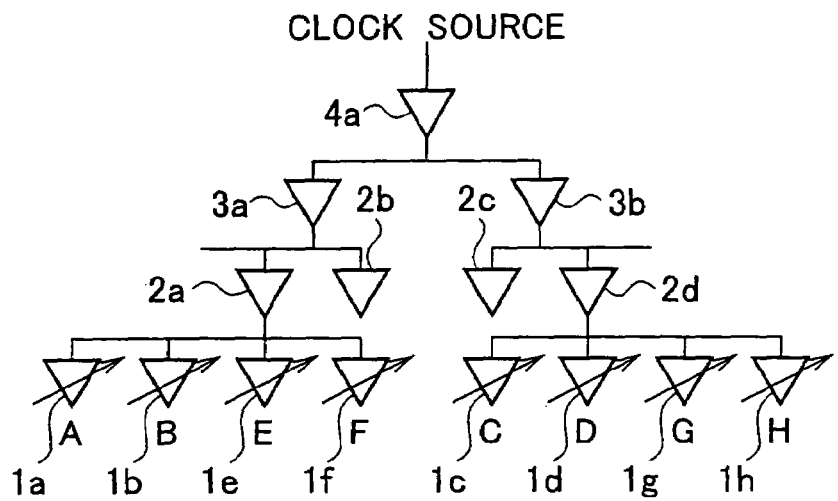
FIG. 1 is a view schematically showing the balanced tree of the prior art.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

(First Embodiment)
Configuration of Phase Detector

Figure 4:
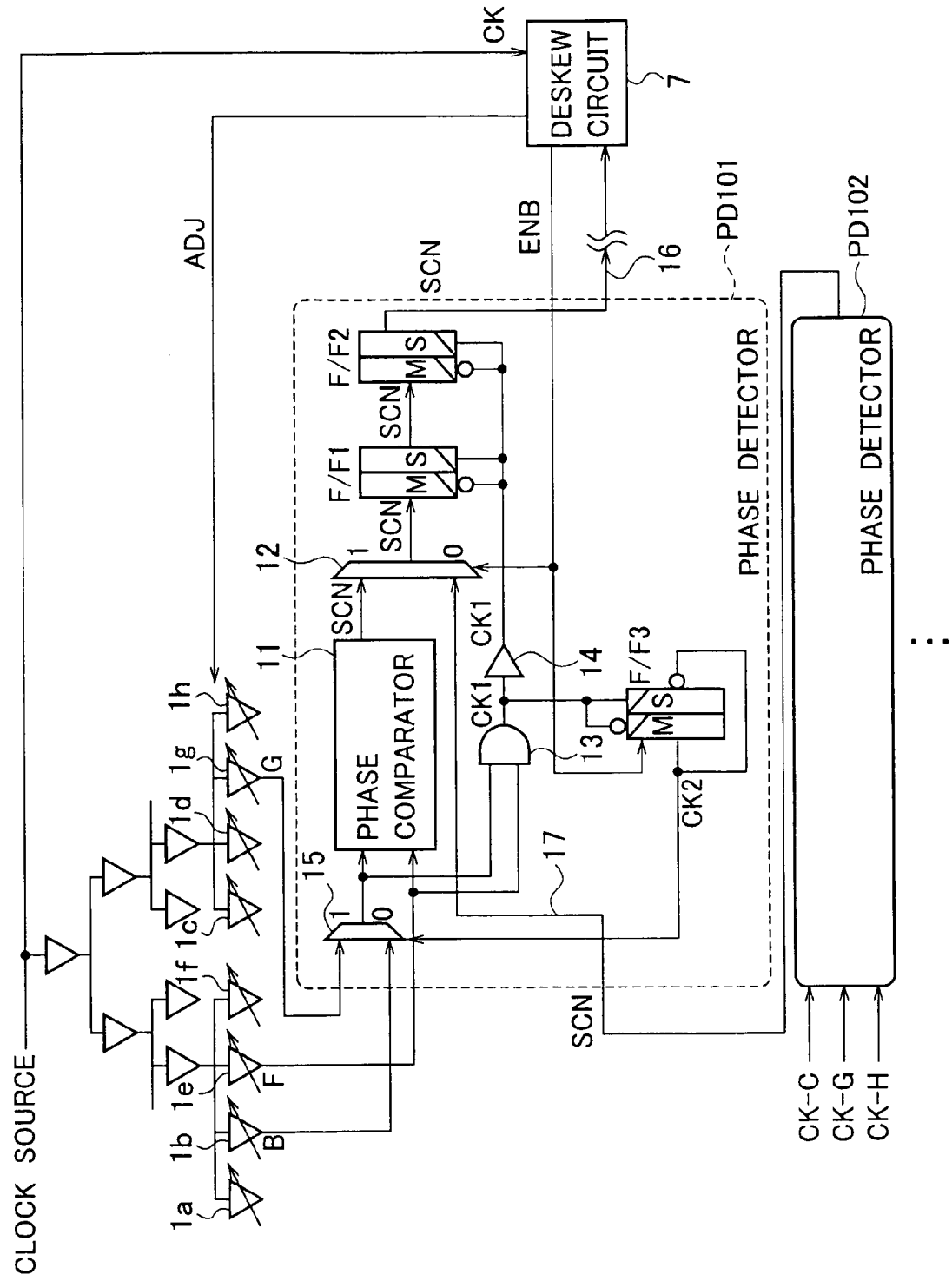
FIG. 4 is a view schematically showing the phase detector and a clock distribution circuit of the first embodiment of the present invention.

As shown in FIG. 4, a phase detector PD101 comprises a multiplexer (a first selection circuit) 15, a phase comparator 11, a multiplexer 12, a F/F1, a F/F2, a F/F3, an AND gate 13, and a buffer 14. The clock CK-B from the domain clock buffer 1b in the domain B and the clock CK-G from the domain clock buffer 1g in the domain G are supplied to the multiplexer 15. The multiplexer 15 selects a first clock from a first group including the clock CK-B and CK-G. The clock CK-G is obtained as the first clock through the multiplexer 15 when a clock CK2 transmitted to the multiplexer 15 from the F/F3 is "1". The clock CK-B is obtained as the first clock through the multiplexer 15 when the clock CK2 is "0". The multiplexer 15 selects the first clock from the supplied clocks and transmits the selected clock to the phase comparator 11. The clock CK-F as a second clock from the domain clock buffer 1f in the domain F is supplied to the phase comparator 11. The phase comparator 11 detects a difference in the phase between the selected clock as the first clock and the clock CK-F as the second clock and transmits the difference in the phase as a scan signal SCN to the multiplexer 12. A scan signal SCN is supplied from another phase detector to the multiplexer 12 through a wire 17. The scan signal SCN from the phase comparator 11 is obtained through the multiplexer 12 when an enable signal ENB supplied to the multiplexer 12 is "1". The scan signal SCN from another phase comparator is obtained through the multiplexer 12 when the enable signal ENB is "0". The multiplexer 12 selects a scan signal SCN from the supplied scan signals and transmits the selected scan signal SCN to the F/F1. The clock selected by the multiplexer 15 and the clock CK-F are supplied to the AND gate 13. A clock CK1 is obtained through the AND gate 13 when both of the clocks selected by the multiplexer 15 and the clock CK-F are 1. The F/F3 divides the frequency of the clock CK1 by two when the enable signal ENB supplied from a deskew circuit 7 is "1". The F/F3 transmits the divided clock CK2 to the multiplexer 15. The buffer 14 buffers the clock CK1 and transmits the clock CK1 to a master latch M and a slave latch S of each of the F/F1 and the F/F2. The F/F1 and the F/F2 stores the value of the scan signal SCN, and transmits the scan signal to the deskew circuit 7 through a wire 16.

A description will be given of an operation of the phase detector PD101 according to the first embodiment of the present invention with reference to the flowchart FIGS. 5(a) to 5(f).

Figure 5:
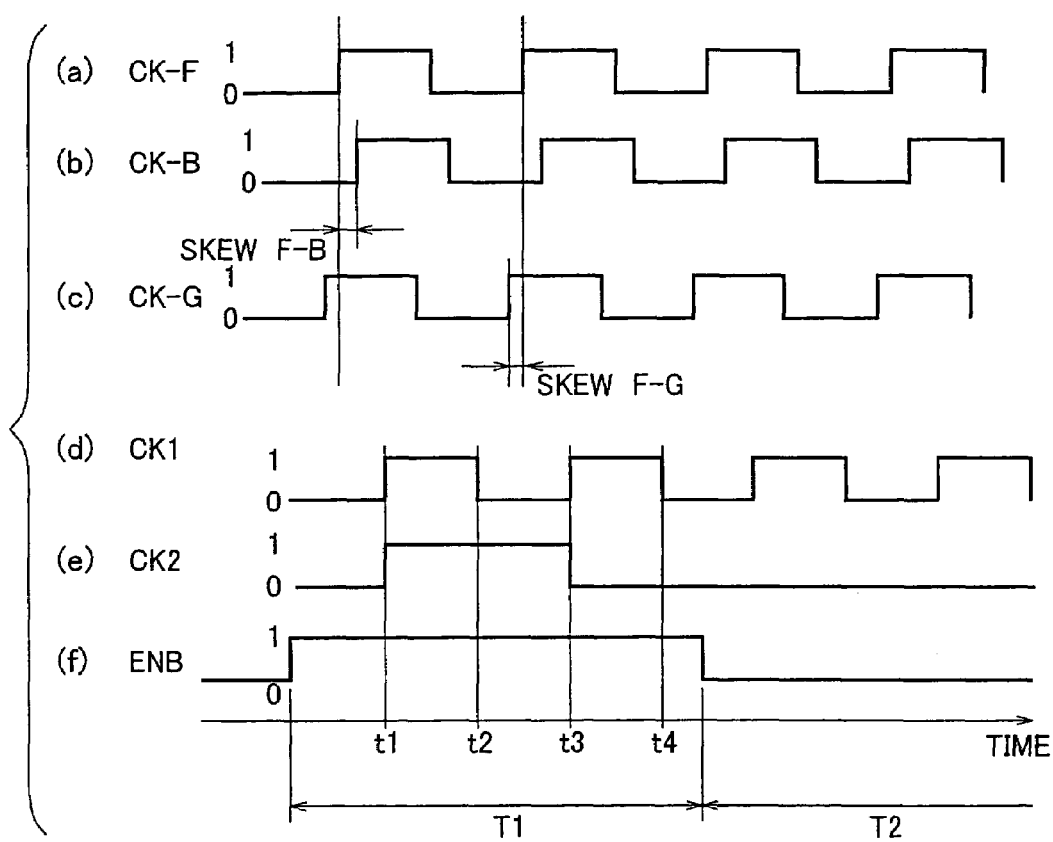
FIG. 5 is a timing chart schematically showing the operation of the phase detector of the first embodiment of the present invention.

As shown in FIG. 5(a), the clock CK-F is supplied to the phase comparator 11 from the domain clock buffer 1f. As shown in FIG. 5(b), the clock CK-B is supplied to the multiplexer 15 from the domain clock buffer 1b. In this case, there is a skew (skew F-B) between the clock CK-F and the clock CK-B. As shown in FIG. 5(c), the clock CK-G is supplied to the multiplexer 15 from the domain clock buffer 1g. Then, there is a skew (skew F-G) between the clock CK-F and the clock CK-G. The multiplexer 15 transmits the selected clock to the phase comparator 11.

The phase comparator 11 transmits the scan signal SCN of the skew F-B and the skew F-G to the multiplexer 12. As shown in FIG. 5(f), the enable signal ENB is supplied to the multiplexer 12 and the F/F3 from the deskew circuit 7. The scan signal SCN from the phase comparator 11 is obtained through multiplexer 12 when enable signal ENB is "1" (duration T1 in FIG. 5(f)). The scan signal SCN from another phase detector is obtained through multiplexer 12 when enable signal ENB is "0" (duration T2 in FIG. 5(f)). As shown in FIG. 5(d), the AND gate 13 supplies the clock CK1 to the F/F1 and the F/F3 when both of the signals selected by multiplexer 15 and the clock CK-F are 1. As shown in FIG. 5(e), F/F3 divides the clock CK1 by two when the enable signal ENB is "1" (duration T1 in FIG. 5(f)). Namely, the leading edge of the clock CK2 occurs at time t1 when the leading edge of the clock CK1 occurs at time t1. The trailing edge of the clock CK2 occurs at time t3 when the next leading edge of the clock CK1 occurs at time t3. The clock CK2 is "0" when the enable signal ENB is "0" (duration T2). The F/F3 transmits the divided clock to the multiplexer 15. The multiplexer 15 selects the clock CK-G when the clock CK2 is "1" (duration t1 to t3). The multiplexer 15 selects the clock CK-B when the clock CK2 is "0". Accordingly, the phase comparator 11 transmits the skew F-G to the F/F1 when the clock CK2 is "1". The phase comparator 11 transmits the skew F-B to the F/F1 when the clock CK2 is "0". The F/F1 loads the scan signal SCN and transmits the scan signal SCN to the F/F2 in synchronization with the leading edge of the clock CK1 at time t1. The F/F2 loads the scan signal SCN from the F/F1 and transmits the scan signal SCN to the deskew circuit 7 in synchronization with the leading edge of the clock CK1.

According to the phase detector of the first embodiment of the present invention, the number of phase detectors is decreased because the phase detector can detect the difference in the phase between a plurality of the clocks in the domains. In consequence, it is easier than ever to design the layout of the LSI and the wire planning in the LSI and to prevent or avoid increase of the LSI area. Moreover, the scan chain wires connecting the phase detectors become shorter and the wire count of enable signals from the deskew circuit to the phase detectors can be reduced. The area of the LSI is decreased. Particularly, a LSI requiring a number of the phase detectors has the above-mentioned benefit.

Configuration of Clock Distribution Circuit

As shown in FIG. 4, a clock distribution circuit of the first embodiment of the present invention includes the domain clock buffers 1a to 1h, the phase detectors PD101, PD102 and the like, the deskew circuit 7, and a clock source. The clock CK-B in the domain B, CK-F in the domain F, and CK-G in the domain G are supplied to the phase detector PD101. Similarly, the clock CK-C in the domain C, CK-G in the domain G, and CK-H in the domain H are supplied to the phase detector PD102. In this case, the three domain clocks are supplied to the one phase detector, respectively. The deskew circuit 7 supplies the enable signal ENB to the phase detector PD101. The deskew circuit 7 supplies the enable signal ENB to each of the phase detectors PD102 and the like (not shown in FIG. 4). The phase detectors PD101 and PD102 are coupled by the wire 17. The phase detector PD101 and deskew circuit 7 are coupled by the wire 16. Thus, the phase detector PD101, PD102 and the like are connected serially to the deskew circuit 7. The difference in the phases of the clocks is supplied to the deskew circuit 7 from the phase detectors PD101, PD102 and the like as the scan signal SCN. A clock CK is supplied to the deskew circuit 7 from the clock source. The deskew circuit 7 loads the scan signals sequentially from the phase detectors PD101, PD102 and the like and calculates the propagation delay of the clocks transmitted from the phase detectors PD101, PD102 and the like, transmits an adjustment signal ADJ which adjusts the clock skew of the domain clock buffers 1a to 1h. The phase detector PD102 and the like have a similar configuration and operation as the phase detector PD101.

According to the clock distribution circuit of the first embodiment of the present invention, the number of phase detectors is decreased because the phase detector can detect a difference in the phase between a plurality of clocks in the domains. In consequence, it is easier than ever to design the layout in the LSI and the wire planning in the LSI and to decrease the LSI area. Moreover, the wire which couples the phase detectors for scan chain is shorter. And area cost for wiring is reduced. The area of the LSI is decreased. Particularly, an LSI requiring a number of the phase detectors has above-mentioned benefit.

Configuration of LSI

Figure 6:
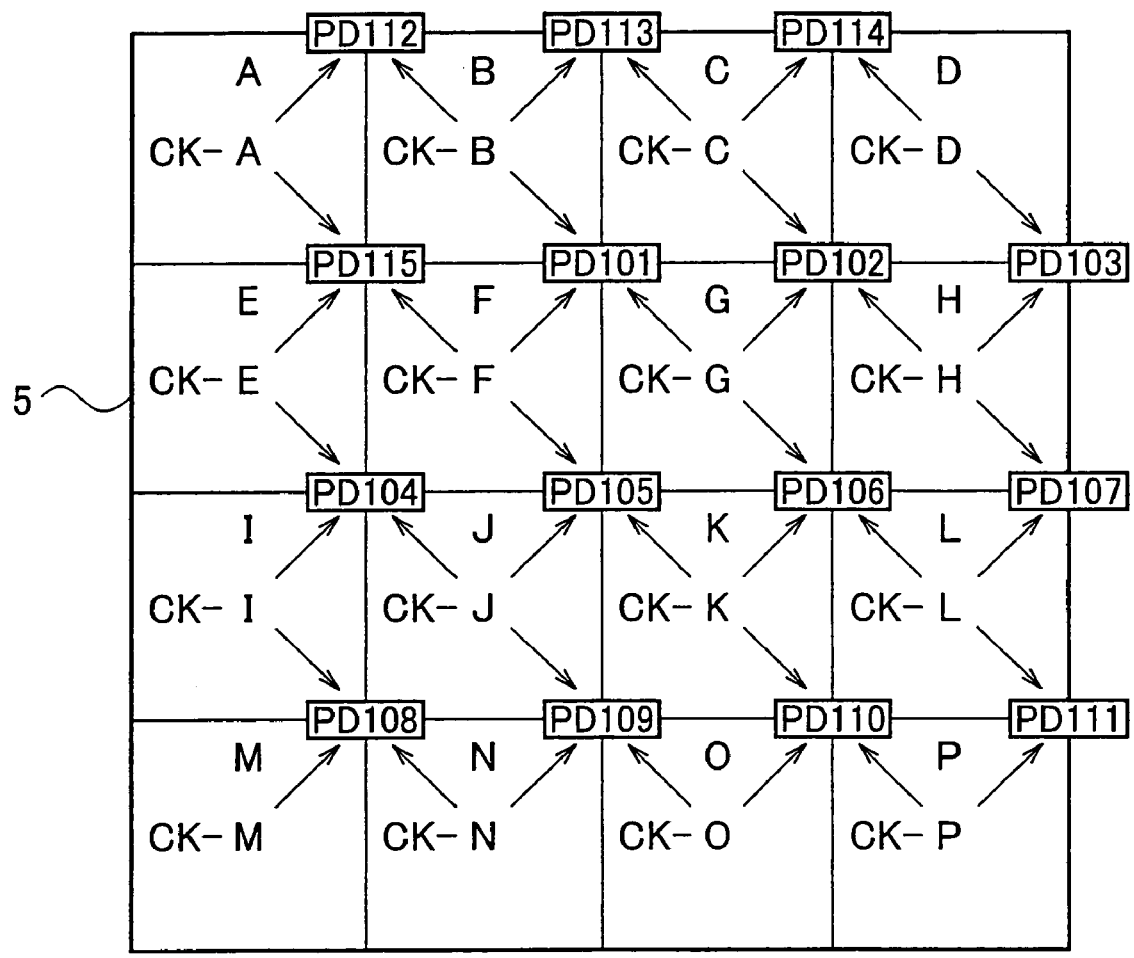
FIG. 6 is a view schematically showing the LSI of the first embodiment of the present invention.

As shown in FIG. 6, a LSI of the first embodiment of the present invention includes the domains A to P having the clock distribution circuit of the first embodiment of the present invention. Moreover, the LSI includes F/Fs and the domain clock buffer supplying the clocks to the F/Fs in each of the domains though the F/Fs and the domain clock buffers are not shown in FIG. 6. The domain B has the domain clock buffer $1b$ shown in FIG. 4. The domain C has the domain clock buffer $1c$ shown in FIG. 4. The domain F has the domain clock buffer $1f$ shown in FIG. 4. The domain G has the domain clock buffer $1g$ shown in FIG. 4. The domain H has the domain clock buffer $1h$ shown in FIG. 4. The phase detectors PD101 to PD115 are placed at intersections of two boundaries of domains A to P in the LSI 5. The clocks CK-B, CK-F and CK-G are supplied to the phase detector PD101 from the domain clock buffers $1b$, $1f$ and $1g$ supplying the clock to the F/Fs in the domains B, F and G, respectively. Similarly, the clocks CK-C, CK-G and CK-H are supplied to the phase detector PD102 from the domain clock buffers $1c$, $1g$ and $1h$ supplying the clock to the F/Fs in the domains C, G and H, respectively. In this case, the clocks are supplied to the phase detectors PD101 to PD115 from the domain clock buffers in the domains verging on each of the phase detectors PD101 to PD115, respectively. Each of the phase detectors loads the clocks from the domain clock buffers in the domains verging with each other.

According to the LSI of the first embodiment of the present invention, the number of phase detectors is decreased because the phase detectors can detect a difference in the phase between a plurality of the clocks in the domains. In consequence, it is easier than ever to design the layout in the LSI and the wire planning in the LSI and to decrease the LSI area. Moreover, the wire which couples the phase detectors for scan chain is shorter and area cost for wining is reduced. Thus, the area of the LSI is decreased. Particularly, a LSI requiring a number of the phase detectors has above-mentioned benefit.

Figure 2:
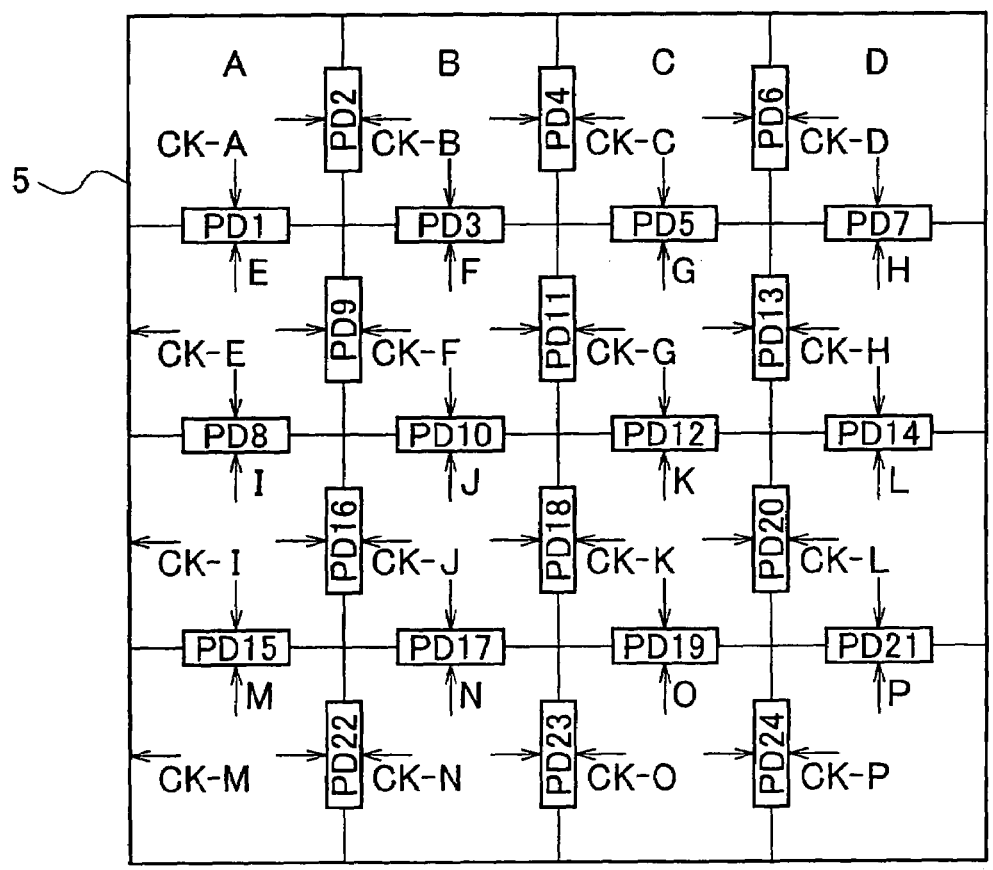
FIG. 2 is a view schematically showing the LSI of the prior art.

For example, as shown in FIG. 2, the phase detectors located on the boundary of the domain detect the skew between two domain clock buffers in two domains facing across the tile boundary in the prior art. Generally, in the case that the LSI is divided into m×m domains, N, which is the number of phase detectors, is shown in formula (1).

$$N = 2m \times (m-1) \qquad (1)$$

In FIG. 2, because the LSI 5 is divided into 4×4 domains, N1, which is the number of phase detectors, is 24 as shown in formula (2).

$$N1 = 2 \times 4 \times (4-1) = 24 \qquad (2)$$

Generally, each of the phase detectors PD1 to PD24 has 128 transistors in the LSI shown in FIG. 2. Then, the total number of transistors in the LSI 5 is 3072 shown in formula (3).

$$128 \times 24 = 3072 \qquad (3)$$

Each of the phase detectors of the first embodiment of the present invention has 204 transistors generally as a result of the multiplexer 15, F/F2 and F/F3 layout. Generally, in the case where the LSI is divided into m×m domains, N, which is the number of phase detectors, is shown in formula (4).

$$N = m \times m - 1 \qquad (4)$$

In FIG. 6, because the LSI of the first embodiment of the present invention is divided into 4×4 domains, N2, which is the number of phase detectors, is 15 as shown in formula (5).

$$N2 = 4 \times 4 - 1 = 15 \qquad (5)$$

Consequently, the total number of transistors in the LSI 5 of the first embodiment of the present invention is 3060 as shown in formula (6).

$$204 \times 15 = 3060 \qquad (6)$$

Finally, the 12-transistor decrease from the prior art in total is shown in formula (7).

$$3072 - 3060 = 12 \qquad (7)$$

The more the domains of the LSI are divided, the more the number of transistors decreases. The ratio of the number of phase detectors shown in the formula (1) to the number of transistors shown in the formula (4) is shown in formula (8).

$$(m \times m - 1)/2m(m-1) = (m+1)(m-1)/2m(m-1) = (m+1)/2m \qquad (8)$$

When "m" is infinitely large, "(m+1)/2m" is ½ as shown in formula (9).

$$I\ im(m \to \infty)[(m+1)/2m] = I\ im(m \to \infty)[(1+1/m)/2] = \tfrac{1}{2} \qquad (9)$$

Therefore, the ratio of the number of transistors in total is 80% as shown in formula (10), that is, the number of transistors decreases of 20%.

$$\tfrac{1}{2} \times 204/128 = 0.797 \qquad (10)$$

Second Embodiment

Configuration of Phase Detector

Figure 7:
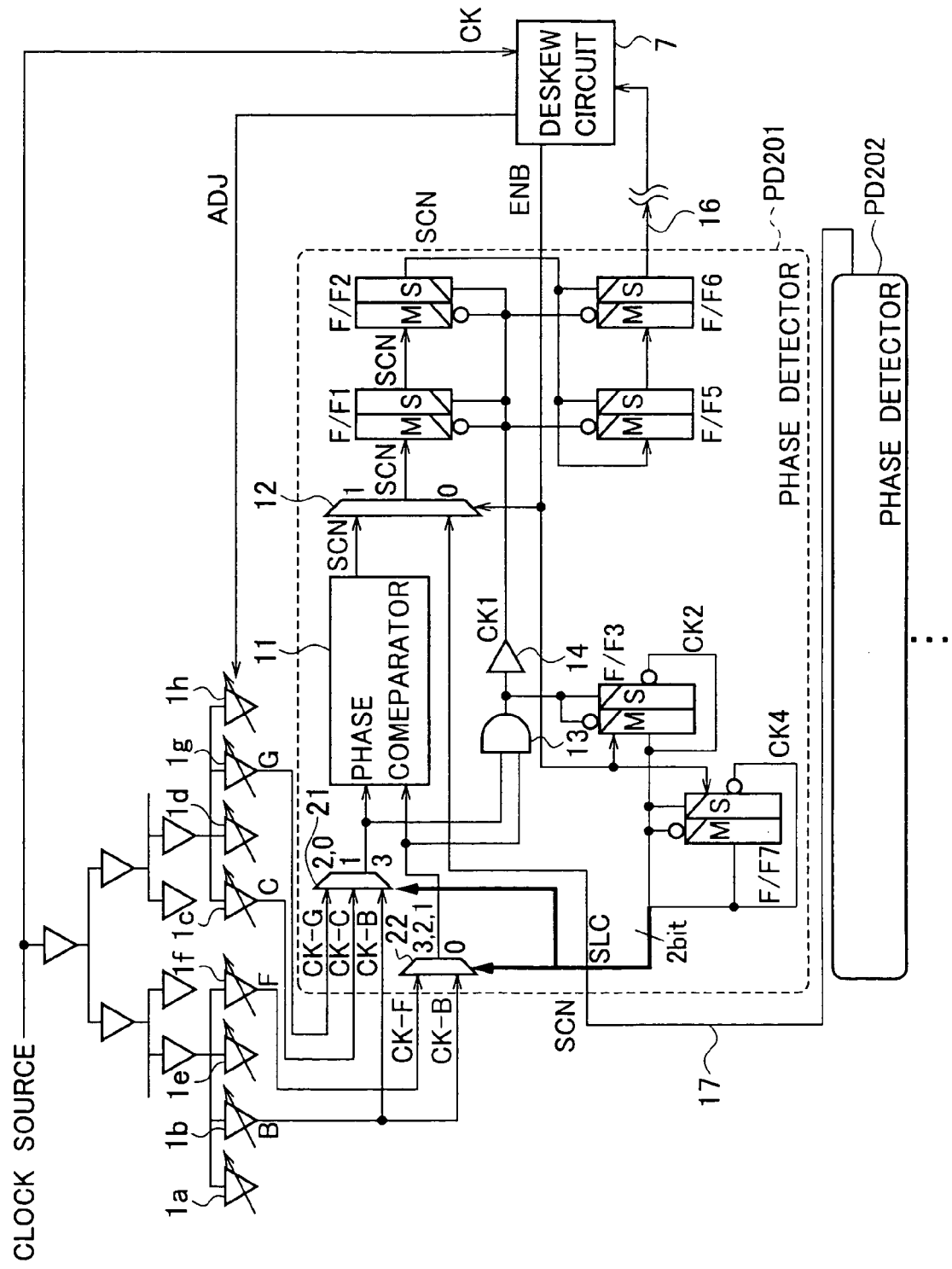
FIG. 7 is a view schematically showing the clock distribution circuit of the second embodiment of the present invention.

As shown in FIG. 7, a phase detector PD201 of a second embodiment of the present invention includes a multiplexer 21, a multiplexer 22, the F/F1, the F/F3, a F/F5, a F/F6, a F/F7, the AND gate 13 and the buffer 14. The clock CK-B from the domain clock buffer $1b$ in the domain B, the clock CK-C from the domain clock buffer $1c$ in the domain C and the clock CK-G from the domain clock buffer $1g$ in the domain G are supplied to the multiplexer 21. The multiplexer 21 selects the first clock from the first group including the clock CK-B, CK-C and CK-G. The clock CK-G is obtained through the multiplexer 21 when a select signal SLC, which is a 2 bit signal composed of the clock CK2 and a clock CK-4 from the F/F7, is "0" or "2" decimally (00 or 10 in binary). The clock CK-C is obtained through the multiplexer 21 when the select signal SLC is "1" decimally (01 in binary). The clock CK-B is obtained through the multiplexer 21 when the select signal SLC is 3 decimally (11 in binary). The multiplexer 21 selects the first clock from the supplied clocks and transmits the first clock to the phase comparator 11. The phase comparator 11, the multiplexer 12, the F/F1, the F/F2, the F/F3, the AND gate 13 and the buffer 14 operate similar to the phase detector of the first embodiment of the present invention.

The F/F7 divides the clock CK2 from the F/F3 by two when the enable signal ENB from the deskew circuit 7 is "1". The F/F7 transmits the clock CK4 to the multiplexer 21 and the multiplexer 22. The F/F5 and the F/F6 store the scan signal SCN and transmit the scan signal SCN to the deskew circuit 7 through the wire 16.

Figure 8:
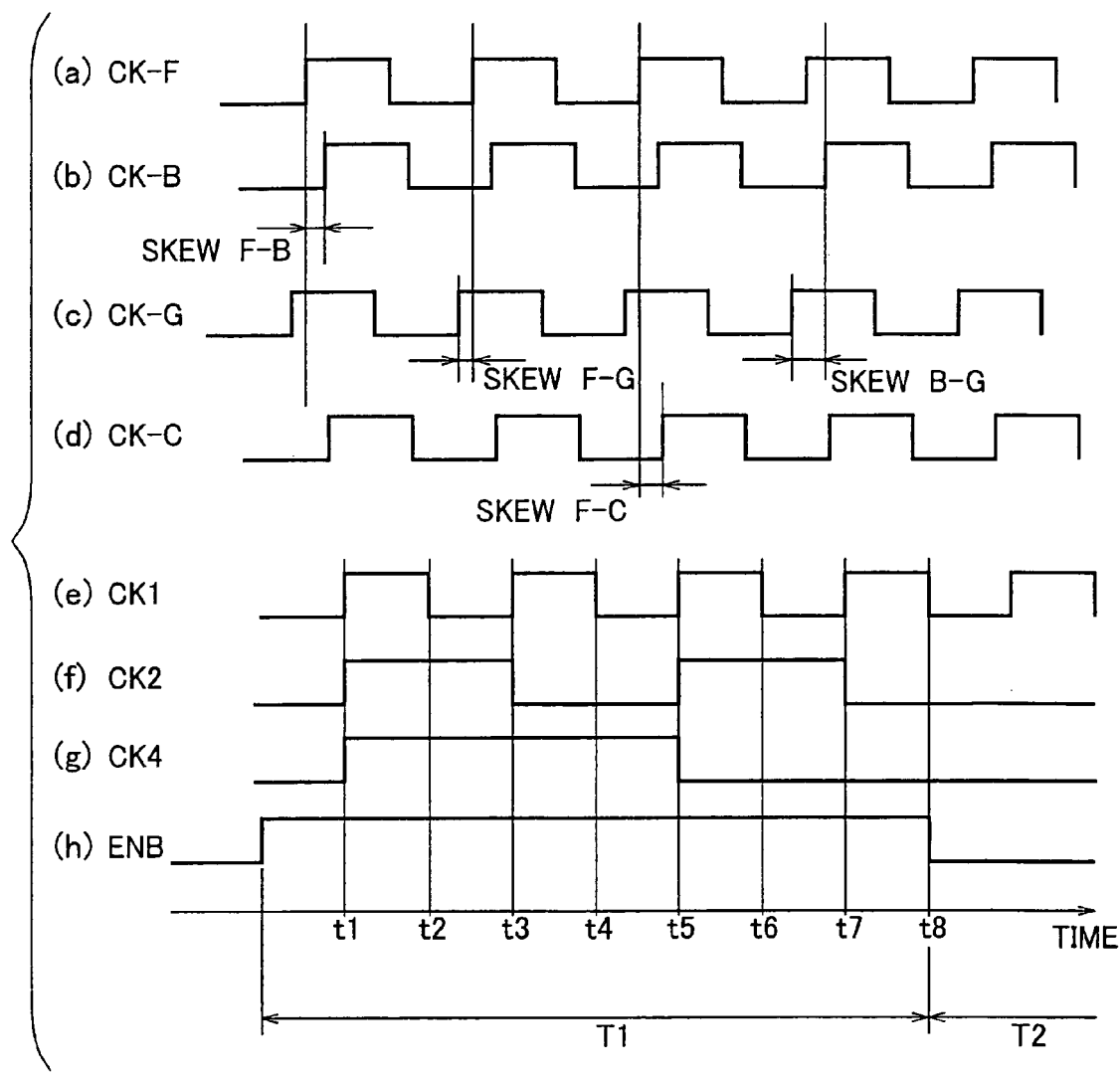
FIG. 8 is a timing chart schematically showing the operation of the phase detector of the second embodiment of the present invention.

A description will be given of an operation of the phase detector PD201 according to the second embodiment of the present invention with reference to the flowchart FIG. 8(*a*) to 5(*h*). As shown in FIG. 8(*a*), the clock CK-F is supplied to the multiplexer 22 from the domain clock buffer 1*f*. As shown in FIG. 8(*b*), the clock CK-B is supplied to the multiplexer 21 and the multiplexer 22 from the domain clock buffer 1*b*. In this case, there is a skew (skew F-B) between the clock CK-F and the clock CK-B. As shown in FIG. 8(*c*), the clock CK-G is supplied to the multiplexer 21 from the domain clock buffer 1*g*. Then, there is a skew (skew F-G) between the clock CK-F and the clock CK-G. There is a skew (skew B-G) between the clock CK-B and the clock CK-G. As shown in FIG. 8(*d*), the clock CK-C is supplied to the multiplexer 21 from the domain clock buffer 1*c*. In this case, there is a skew (skew C-F) between the clock CK-C and the clock CK-F. The multiplexer 21 selects the first clock from the clocks CK-B, CK-C and CK-G and transmits the first clock to the phase comparator 11. The multiplexer 22 selects a second clock from a second group including the clocks CK-B and CK-F and transmits the second clock to the phase comparator 11. The phase comparator 11 transmits the scan signal SCN of the skew B-G, the skew C-F, the skew F-C and the skew B-F to the multiplexer 12. As shown in FIG. 8(*h*), the enable signal ENB is supplied to the multiplexer 12, the F/F3 and the F/F7 from the deskew circuit 7. The scan signal SCN from the phase comparator 11 is obtained through multiplexer 12 when enable signal ENB is "1" (duration T1 in FIG. 8(*h*)). The scan signal SCN from another phase detector is obtained through multiplexer 12 when enable signal ENB is "0" (duration T2 in FIG. 8(*h*)). As shown in FIG. 8(*e*), the AND gate 13 supplies the clock CK1 to the F/F3 and the buffer 14 when both of the signals selected by multiplexer 21 and multiplexer 22 are 1. As shown in FIG. 8(*f*), F/F3 divides the clock CK1 by two when the enable signal ENB is "1" (duration T1 in FIG. 8(*h*)). Namely, the leading edge of the clock CK2 occurs at time t1 when the leading edge of the clock CK1 occurs at time t1. The trailing edge of the clock CK2 occurs at time t3 when the next leading edge of the clock CK1 occurs at time t3. The clock CK2 is "0" when the enable signal ENB is "0" (duration T2). The F/F3 transmits the divided clock to the multiplexer 21 and the multiplexer 22. As shown in FIG. 8(*g*), F/F7 divides the clock CK2 by two when the enable signal ENB is "1" (duration T1 in FIG. 8(*h*)). Namely, the leading edge of the clock CK4 occurs at time t1 when the leading edge of the clock CK2 occurs at time t1. The trailing edge of the clock CK4 occurs at time t3 when the next leading edge of the clock CK2 occurs at time t5. The clock CK4 is "0" when the enable signal ENB is "0" (duration T2). The F/F7 transmits the divided clock to the multiplexer 21 and the multiplexer 22.

The multiplexer 21 selects the clock CK-B when both of the clocks CK2 and CK4 are "1" (duration t1 to t3). The multiplexer 21 selects the clock CK-G when the clock CK2 is "0" and the clock CK4 is "1" (duration t3 to t5). The multiplexer 21 selects the clock CK-C when the clock CK2 is "1" and the clock CK4 is "0" (duration t5 to t7). The multiplexer 21 selects the clock CK-G when both of the clocks CK2 and CK4 are "0" (duration t7 to t8). The F/F5 and the F/F6 operate similar to the F/F1 or the F/F2. The F/F5 loads the scan signal SCN from the F/F2 and transmits the scan signal SCN to the F/F6. The F/F6 loads the scan signal SCN from the F/F5 and transmits the scan signal SCN to the deskew circuit 7.

According to the phase detector of the second embodiment of the present invention, the number of phase detectors is decreased because the phase detectors can detect difference in the phase between a plurality of the clocks in the domains. As a consequence, it is easier than ever to design the layout in the LSI and the wire planning in the LSI and to decrease the LSI area. Moreover, the wire which couples the phase detectors for the scan chain is shorter and area cost for wiring is reduced. An area of the LSI is decreased. Because the clocks from the domains having a diagonal relationship with each other are compared in the phase, the adjustment of the phase difference in the phases is more precise than the prior art. Particularly, a LSI requiring a number of the phase detectors has above-mentioned benefit.

Configuration of Clock Distribution Circuit

As shown in FIG. 7, a clock distribution circuit of the second embodiment of the present invention includes the domain clock buffers 1*a* to 1*h*, the phase detectors PD201, PD202 and the like, the deskew circuit 7, and the clock source. The clock CK-B in the domain B, CK-C in the domain C, CK-F in the domain F, and CK-G in the domain G are supplied to the phase detector PD201. Similarly, the domain clocks in the domain A to H are supplied to the phase detectors PD202 and the like, respectively. The deskew circuit 7 supplies the enable signal ENB to the phase detector PD201. Similarly, the deskew circuit 7 supplies the enable signal ENB to each of the phase detectors PD202 and the like (not shown in FIG. 7). The phase detectors PD201 and PD202 are coupled by the wire 17. The phase detector PD201 and deskew circuit 7 are coupled by the wire 16. Thus, the phase detector PD201, PD202 and the like are connected serially to the deskew circuit 7. The difference in the phases of the clocks is supplied to the deskew circuit 7 from the phase detectors PD201, PD202 and the like as the scan signal SCN. The clock CK is supplied to the deskew circuit 7 from the clock source. The deskew circuit 7 loads the scan signals sequentially from the phase detectors PD201, PD202 and the like and calculates the propagation delay of the clocks transmitted from the phase detectors PD201, PD202 and the like, and transmits the adjustment signal ADJ which adjusts the clock skew of the domain clock buffers 1*a* to 1*h*. The phase detector PD202 and the like have a similar configuration and operation as the phase detector PD201.

According to the clock distribution circuit of the second embodiment of the present invention, the number of phase detectors is decreased because the phase detectors can detect the difference in the phase between a plurality of the clocks in the domains. As a consequence, it is easier than ever to design the layout in the LSI and the wire planning in the LSI and to decrease the LSI area. Moreover, the wire which couples the phase detectors for scan chain is shorter and area cost for wiring is reduced. The area of the LSI is decreased. Because the clocks from the domains which have a diagonal relationship with each other are compared in the phase, the adjustment of the phase difference in the phases is more precise than the prior art. Particularly, the LSI requiring a number of the phase detectors has the above-mentioned benefit.

Configuration of LSI

Figure 9:
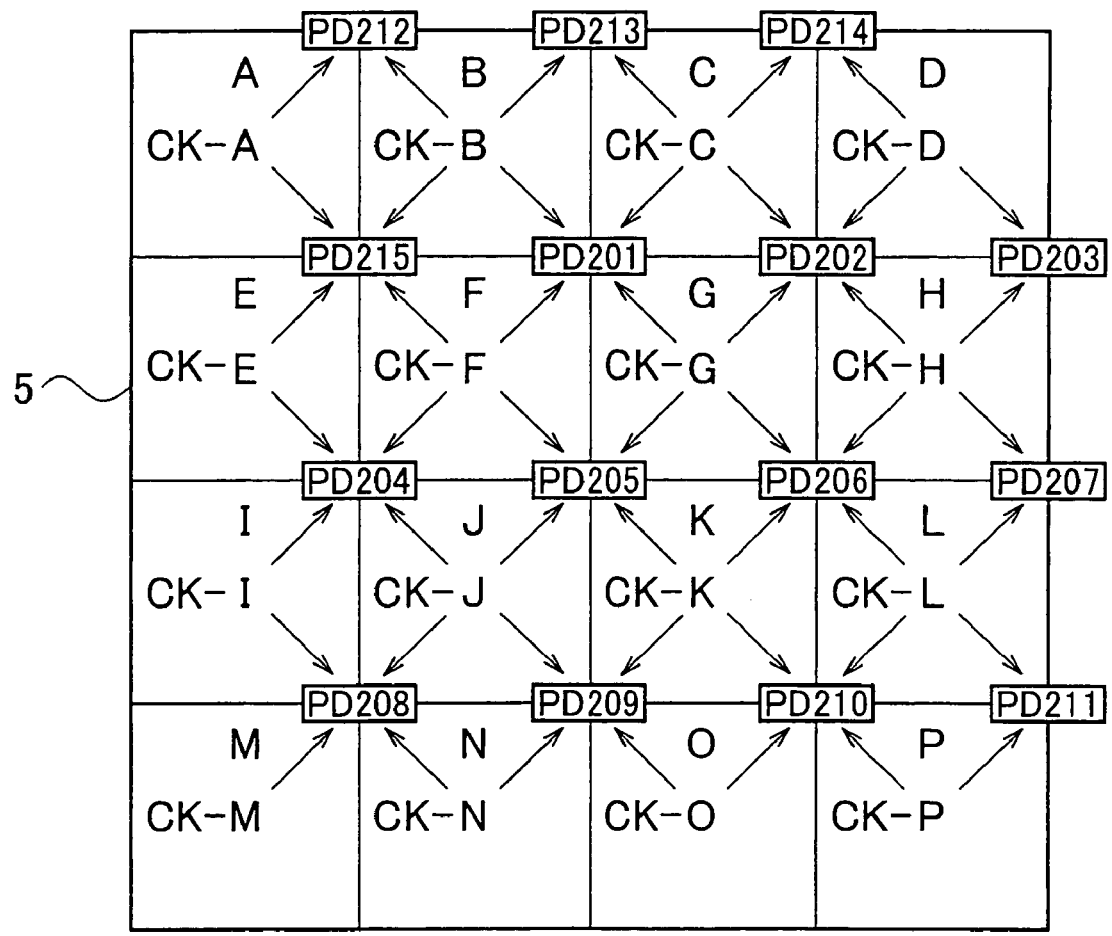
FIG. 9 is a view schematically showing the LSI of the second embodiment of the present invention.

As shown in FIG. 9, a LSI of the second embodiment of the present invention includes the domain A to P having the clock distribution circuit of the first embodiment of the present invention. Moreover, the LSI includes F/Fs and the domain clock buffer supplying the clocks to the F/Fs in each of the domains though the F/Fs (the domain clock buffers are not shown in FIG. 9). The phase detectors PD201 to PD215 are placed at intersections of two boundaries of domains A to P in the LSI 5. The clocks CK-B, CK-C, CK-F and CK-G are supplied to the phase detector PD201 from the domain clock buffers 1$b$, 1$c$, 1$f$ and 1$g$ supplying the clock to the F/Fs in the domains B, C, F and G, respectively. Similarly, the clocks CK-A to CK-P are supplied to the phase detectors PD202 and the like from the domain clock buffers 1$a$ to 1$p$ (not shown in FIG. 9) supplying the clocks to the F/Fs in the domains A to P, respectively. In this case, the clocks are supplied to the phase detectors PD201 to PD215 from the domain clock buffers in the domains verging on each of the phase detectors PD201 to PD215, respectively. Each of the phase detectors loads the clocks from the domain clock buffers in the domains verging with each other.

According to the LSI of the second embodiment of the present invention, the number of phase detectors is decreased because the phase detectors can detect difference in the phase between a plurality of the clocks in the domains. As a consequence, it is easier than ever to design the layout in the LSI and the wire planning in the LSI and to decrease the LSI area. Moreover, the wire which couples the phase detectors for scan chain is shorter and area cost for wiring is reduced. The area of the LSI is decreased. Because the clocks from the domains having a diagonal relationship with each other are compared in the phase, the adjustment of the phase difference in the phases is more precise than the prior art. Particularly, the LSI requiring a number of the phase detectors has above-mentioned benefit.

Figure 3:
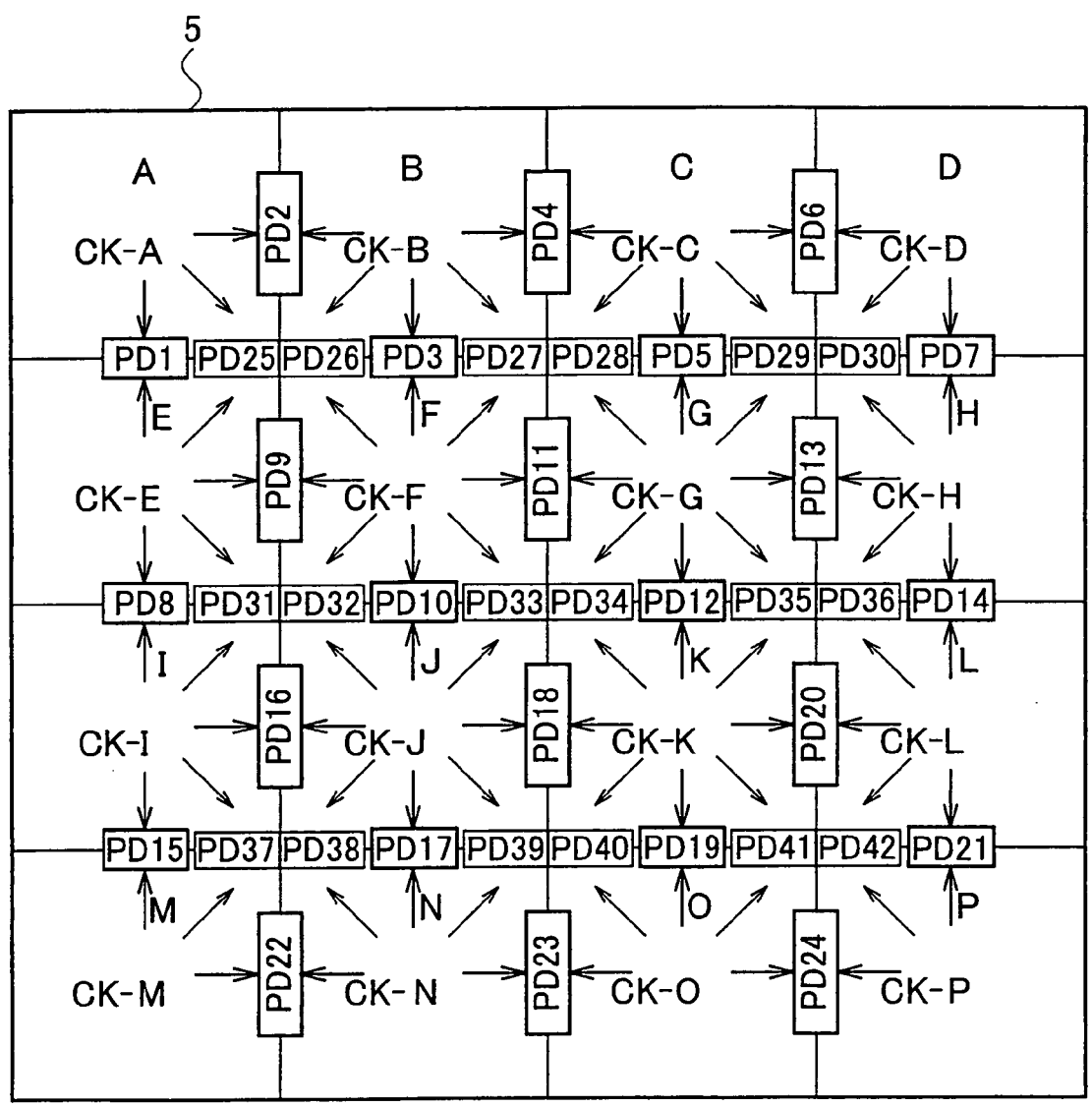
FIG. 3 is a view schematically showing the LSI of the related art.

For example, as shown in FIG. 3, the phase detectors are located on the boundaries and the intersections of the domains. Then the phase detectors located on the boundaries detect the skew between two domain clock buffers in two domains faced across the boundary as known in the related art. Then the phase detectors located on the intersections detect the skew between two domain clock buffers in two domains having a diagonal relationship as know the related art. Generally, in the case that the LSI is divided into m×m domains, N, which is the number of phase detectors, is shown in formula (11).

$$N=2(m-1)(2m-1) \tag{11}$$

In FIG. 3, because the LSI 5 is divided into 4×4 domains, N3, which is the number of phase detectors, is 42, as shown in formula (12).

$$N3=2\times(4-1)\times(2\times4-1)=42 \tag{12}$$

Generally, each of the phase detectors PD1 to PD42 has 128 transistors in the LSI shown in FIG. 3. Then, the total number of transistors in the LSI 5 is 5376, as shown in formula (13).

$$128\times42=5376 \tag{13}$$

Each of the phase detectors of the second embodiment of the present invention has 332 transistors generally as a result of the multiplexer 21, multiplexer 22, F/F2, F/F3, F/F5, F/F6 and F/F7 layout. Generally, when the LSI is divided into m×m domains, N is the number of phase detectors, as shown in formula (14).

$$N=m\times m-1 \tag{14}$$

In FIG. 9, because the LSI of the second embodiment of the present invention is divided into 4×4 domains, N4, which is the number of phase detectors, is 15, as shown in formula (15).

$$N4=4\times4-1=15 \tag{15}$$

Consequently, the total number of transistors in the LSI 5 of the second embodiment of the present invention is 4980, as shown in formula (16).

$$332\times15=4980 \tag{16}$$

Finally, the 396 transistors decrease from that known in the related art in total is shown in formula (17).

$$5376-4980=396 \tag{17}$$

The more the domains of the LSI are divided, the more the number of transistors decreases. The ratio of the number of phase detectors shown in the formula (11) to the number of transistors shown in the formula (14) is shown in formula (18).

$$(m\times m-1)/2(m-1)(2m-1)=(m+1)(m-1)/2(m-1) \\ (2m-1)=(m+1)/2(2m-1) \tag{18}$$

When "m" is infinitely large, "$(m+1)/2(2m-1)$" is ¼ as shown in formula (19).

$$\lim(m\to\infty)[(m+1)/2(2m-1)]=\lim(m\to\infty)[(1+1/m)/2 \\ (2-1/m)]=¼$$

Therefore, the ratio of the number of transistors in total is about 65% as shown in formula (20). The number of transistors decreases by about 35%.

$$¼\times332/128=0.648 \tag{20}$$

(Other Embodiments)

Figure 10:
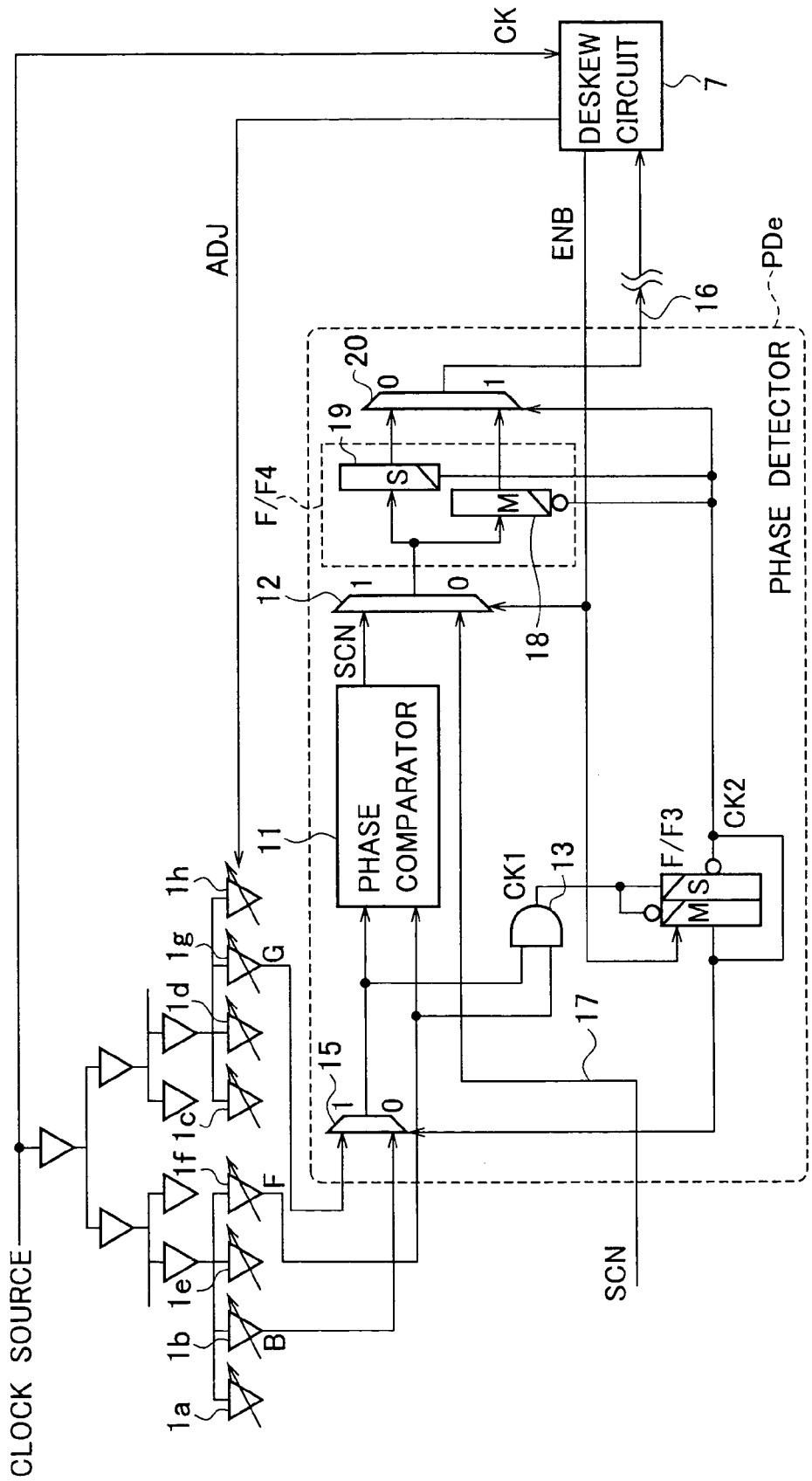
FIG. 10 is a view schematically showing the phase detector and the clock distribution circuit of the other embodiment of the present invention.

As shown in FIG. 10, a phase detector, a clock distribution circuit, and a LSI of other embodiments of the present invention are similar to the phase detector, the clock distribution circuit and the LSI shown in FIG. 4. However, the phase detector, the clock distribution circuit and the LSI of other embodiments include a F/F4 and a multiplexer 20 instead of the F/F1 and the F/F2. The F/F4 is a double edge trigger flip-flop which has a master latch 18 and a slave latch 19. The master latch 18 and the slave latch 19 are connected in parallel with the multiplexer 12. The clock CK2 is supplied to the master latch 18, the slave latch 19 and the multiplexer 20 from the F/F3. The master latch 18 loads the scan signal SCN and transmits the scan signal SCN to the multiplexer 20 when the clock CK2 is "0". The slave latch 19 loads the scan signal SCN and transmits the scan signal SCN to the multiplexer 20 when the clock CK2 is "1". The multiplexer 20 transmits the scan signal SCN from the master latch 18 to the deskew circuit 7 when the clock CK2 is "1". The multiplexer 20 transmits the scan signal SCN from the slave latch 19 to the deskew circuit 7 when the clock CK2 is "0". The double edge trigger F/F4 doubles as the F/F1 and the F/F2. The total number of latches in the F/F4 is half as many as in the F/F1 and the F/F2. The total number of transistors in the phase detector PD101 decreases even though the phase detector PD101 includes the multiplexer 20. The number of transistors in the phase detector PD101 is 190 generally.

In the phase detector, the clock distribution circuit and the LSI of the first and second embodiment of the present invention, the phase detectors PD101 to PD115 and PD201 to PD215 are located at the intersections of boundaries of the domains A to P. However, each of the phase detectors may be located in a position so that the clocks from the domain clock buffers reach the phase detectors at about the same time. For example, as shown in FIG. 6, the phase detector PD101 may be located in the position where the clocks CK-B, CK-F and CK-G from the clock buffers 1$b$, 1$f$ and 1$g$ reach the phase detector PD101 at about the same time. As shown in FIG. 9, the phase detector PD201 may be located in the position where the clocks CK-B, CK-C, CK-F and CK-G from the clock buffers 1b, 1c, 1f and 1g reach the phase detector PD201 at about the same time.

In the phase detector, the clock distribution circuit and the LSI of the first and second embodiment of the present invention, the skews of the domain clock buffers 1a to 1h are adjusted by the adjustment signal ADJ. The adjustment of the skews may be performed once for all of the clock buffers and the adjusted value may be fixed. The adjustment of the skews may be performed dynamically and the adjusted value may change at any time.

Various modifications will become possible for those skilled in the art after receiving the teachings of the present disclosure without departing from the scope thereof.

What is claimed is:

1. A phase detector comprising:
   a first selection circuit configured to select a first clock from a first group of clocks supplied to the first selection circuit and to transmit the first clock;
   at least one phase comparator configured to detect a difference in phases between the first clock and a second clock supplied to the phase comparator and to transmit the difference as a scan signal;
   a first latch configured to receive the scan signal and to store the scan signal when a third clock is supplied to the first latch; and
   a second latch configured to store the scan signal when a reverse phase of the third clock is supplied to the second latch.

2. The phase detector of claim 1, further comprising a second selection circuit configured to select the second clock from a second group of clocks and to transmit the second clock to the phase comparator.

3. The phase detector of claim 2, further comprising:
   an AND gate configured to pass the third clock through when the first clock and the second clock are in-phase; and
   a first flip-flop configured to divide the third clock by two and to transmit the divided clock as a fourth clock.

4. The phase detector of claim 1, further comprising:
   an AND gate configured to pass the third clock through when the first clock and the second clock are in-phase; and
   a first flip-flop configured to divide the third clock by two and to transmit the divided clock as a fourth clock.

5. The phase detector of claim 4, further comprising: a second flip-flop configured to divide the fourth clock by two and to transmit the divided clock as a fifth clock to the second selection circuit.

6. A clock distribution circuit comprising:
   a plurality of domain clock buffers configured to supply clocks to logic elements;
   a first selection circuit configured to select a first clock from a first group of the clocks supplied from the domain clock buffers and to transmit the first clock;
   at least one phase comparator configured to detect a difference in phases between the first clock and a second clock supplied to the phase comparator and to transmit the difference as a scan signal;
   a first latch configured to receive the scan signal and to store the scan signal when a third clock is supplied to the first latch; and
   a second latch configured to store the scan signal when a reverse phase of the third clock is supplied to the second latch.

7. The clock distribution circuit of claim 6 wherein each of the phase comparators is coupled with the domain clock buffers with the same propagation delay from the domain clock buffers.

8. The clock distribution circuit of claim 6, further comprising a second selection circuit configured to select the second clock from a second group of the clocks and to transmit the second clock to the phase comparator.

9. The clock distribution circuit of claim 6, further comprising:
   an AND gate configured to pass the third clock through when the first clock and the second clock are in-phase; and
   a first flip-flop configured to divide the third clock by two and to transmit the divided clock as a fourth clock.

10. The clock distribution circuit of claim 6, further comprising a deskew circuit configured to calculate a propagation delay of the clock from the domain clock buffer and to adjust a clock skew of the domain clock buffers.

11. A LSI comprising:
   a plurality of divided domains in the LSI area;
   at least one clock buffer configured to supply clocks to logic elements in the domains;
   a first selection circuit configured to select a first clock from a first group of the clocks supplied from the domain clock buffers and to transmit the first clock;
   at least one phase comparator configured to detect a difference in phases between the first clock and a second clock supplied to the phase comparator and to signal the difference as a scan signal;
   a first latch configured to receive the scan signal and to store the scan signal when a third clock is supplied to the first latch; and
   a second latch configured to store the scan signal when a reverse phase of the third clock is supplied to the second latch.

12. The LSI of claim 11 wherein each of the phase comparators are located at intersections of two boundaries of the domains.

13. The LSI of claim 11, further comprising a second selection circuit configured to select the second clock sequentially from a plurality of a second group of the clocks and to transmit the selected clock to the phase comparator.

14. The LSI of claim 11, further comprising:
   an AND gate configured to pass the third clock through when the first clock and the second clock are in-phase; and
   a first flip-flop configured to divide the third clock by two and to transmit the divided clock as a fourth clock.

15. The LSI of claim 11, further comprising: a deskew circuit configured to calculate a propagation delay of the clock from the domain clock buffer and to adjust a clock skew of the domain clock buffers.

* * * * *